United States Patent
Shishido et al.

(10) Patent No.: US 9,478,461 B2
(45) Date of Patent: Oct. 25, 2016

(54) CONDUCTIVE LINE STRUCTURE WITH OPENINGS

(71) Applicant: SanDisk Technologies Inc., Plano, TX (US)

(72) Inventors: Kiyokazu Shishido, Yokkaichi (JP); Takuya Futase, Yokkaichi (JP); Hiroto Ohori, Yokkaichi (JP); Kotaro Jinnouchi, Yokkaichi (JP); Noritaka Fukuo, Yokkaichi (JP); Yuji Takahashi, Yokkaichi (JP); Fumiaki Toyama, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/495,483

(22) Filed: Sep. 24, 2014

(65) Prior Publication Data

US 2016/0086848 A1   Mar. 24, 2016

(51) Int. Cl.
| | |
|---|---|
| H01L 21/44 | (2006.01) |
| H01L 21/768 | (2006.01) |
| H01L 27/02 | (2006.01) |
| H01L 27/115 | (2006.01) |

(52) U.S. Cl.
CPC ..... H01L 21/76892 (2013.01); H01L 27/0207 (2013.01); H01L 27/11524 (2013.01)

(58) Field of Classification Search
CPC .......... H01L 21/76892; H01L 23/528; H01L 21/768
USPC ................. 438/618, 671; 257/773
See application file for complete search history.

(56) References Cited

U.S. PATENT DOCUMENTS

| | | | |
|---|---|---|---|
| 7,737,015 B2 | 6/2010 | Kohli et al. | |
| 7,795,080 B2 | 9/2010 | Orimoto et al. | |
| 7,800,155 B2 | 9/2010 | Matsuno | |
| 7,863,190 B1 | 1/2011 | Papasouliotis et al. | |
| 7,884,415 B2 | 2/2011 | Nagano | |
| 7,905,959 B2 | 3/2011 | Tzu et al. | |
| 8,053,347 B2 | 11/2011 | Kang et al. | |
| 8,129,264 B2 | 3/2012 | Kim et al. | |
| 8,362,542 B2 | 1/2013 | Kang et al. | |
| 8,383,479 B2 | 2/2013 | Purayath et al. | |
| 8,603,890 B2 | 12/2013 | Purayath et al. | |
| 8,810,036 B2 * | 8/2014 | Min .................... | H01L 27/0203 257/773 |
| 8,922,020 B2 * | 12/2014 | Chen ................... | H01L 21/0337 257/692 |
| 9,224,744 B1 * | 12/2015 | Yokota ................ | H01L 21/0338 |
| 2006/0194390 A1 | 8/2006 | Imai et al. | |
| 2007/0184615 A1 | 8/2007 | Brazzelli et al. | |
| 2007/0257305 A1 | 11/2007 | Sasago et al. | |
| 2008/0283898 A1 | 11/2008 | Kuniya | |
| 2009/0212352 A1 | 8/2009 | Aoyama et al. | |
| 2009/0267131 A1 | 10/2009 | Nitta | |
| 2010/0019311 A1 | 1/2010 | Sato et al. | |
| 2010/0127320 A1 | 5/2010 | Nishihara et al. | |
| 2010/0230741 A1 | 9/2010 | Choi et al. | |
| 2011/0057250 A1 | 3/2011 | Higashi et al. | |

(Continued)

FOREIGN PATENT DOCUMENTS

EP   1835530 A2   9/2007

*Primary Examiner* — Caleb Henry
(74) *Attorney, Agent, or Firm* — Davis Wright Tremaine LLP

(57) ABSTRACT

Wide and narrow mandrels that are used to form sidewall spacers for patterning are formed in a sacrificial layer with openings in wide mandrels near sides of the wide mandrels. Sidewall spacers are formed on the sides of mandrels and the sacrificial layer is removed. The sidewall spacers are then used for patterning of underlying layers.

21 Claims, 9 Drawing Sheets

(56) References Cited

U.S. PATENT DOCUMENTS

| | | |
|---|---|---|
| 2011/0303967 A1 | 12/2011 | Harari et al. |
| 2013/0072022 A1* | 3/2013 | Lee .................... H01L 21/0337 438/696 |
| 2014/0057436 A1* | 2/2014 | Chen ................... H01L 21/0337 438/675 |
| 2014/0087554 A1* | 3/2014 | Wells ................... H01L 27/101 438/613 |
| 2014/0191405 A1* | 7/2014 | Lee .................... H01L 21/0337 257/773 |
| 2014/0264953 A1* | 9/2014 | Lim .................. H01L 21/76897 257/786 |
| 2014/0273433 A1* | 9/2014 | Lee ................... H01L 21/76816 438/637 |
| 2014/0374809 A1* | 12/2014 | Park .................... H01L 27/1085 257/296 |
| 2015/0021782 A1* | 1/2015 | Kodama ............. G06F 17/5077 257/773 |
| 2015/0054168 A1* | 2/2015 | Wells .................. H01L 21/0337 257/773 |

\* cited by examiner

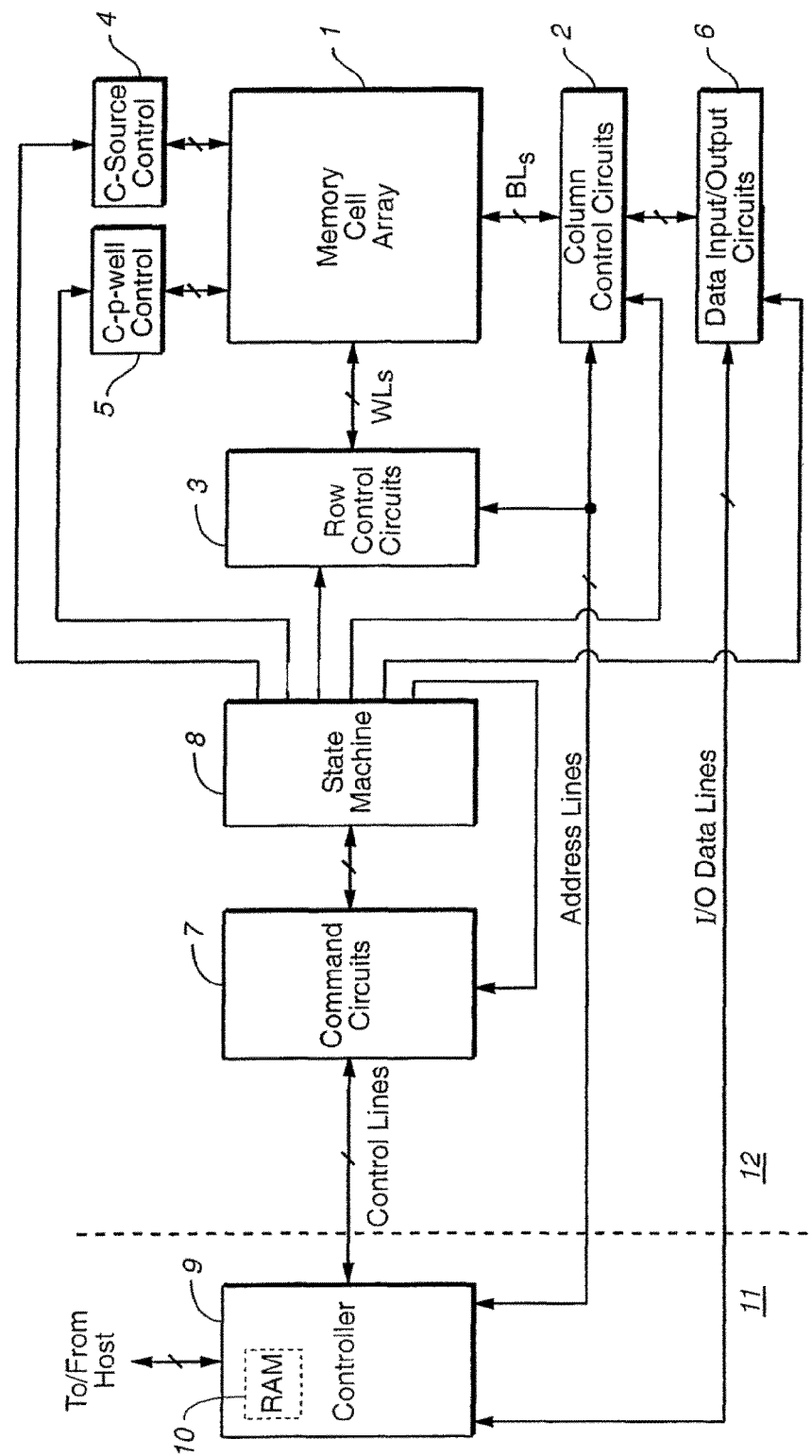
*FIG._1 (Prior Art)*

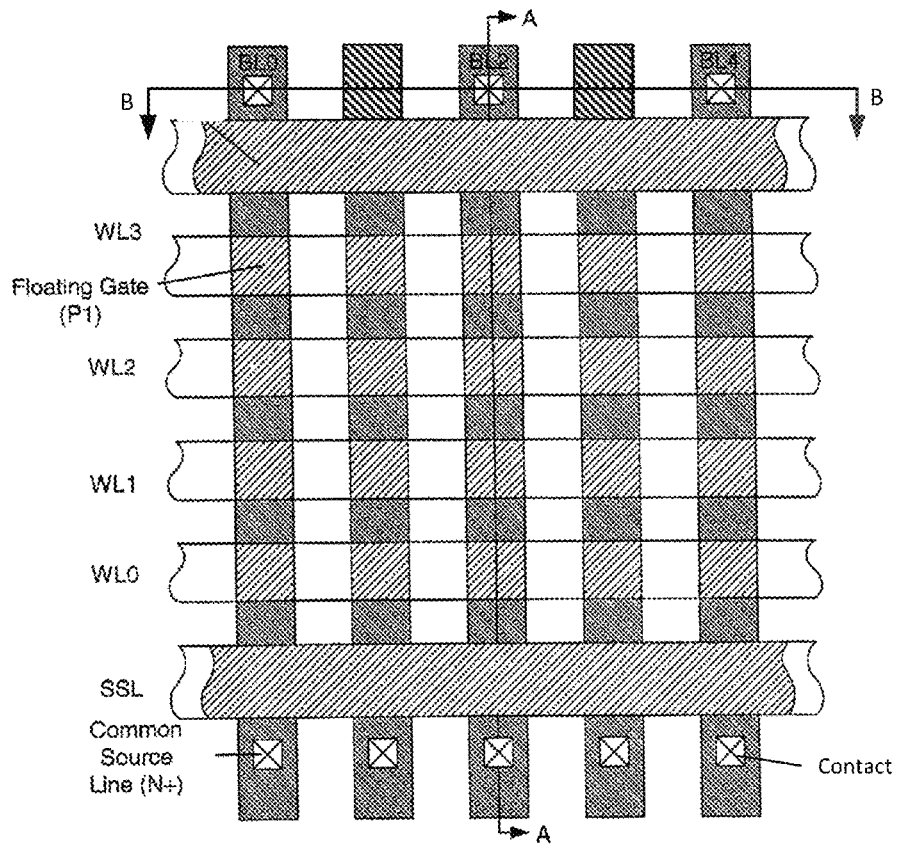
FIG._ 2A (PRIOR ART)
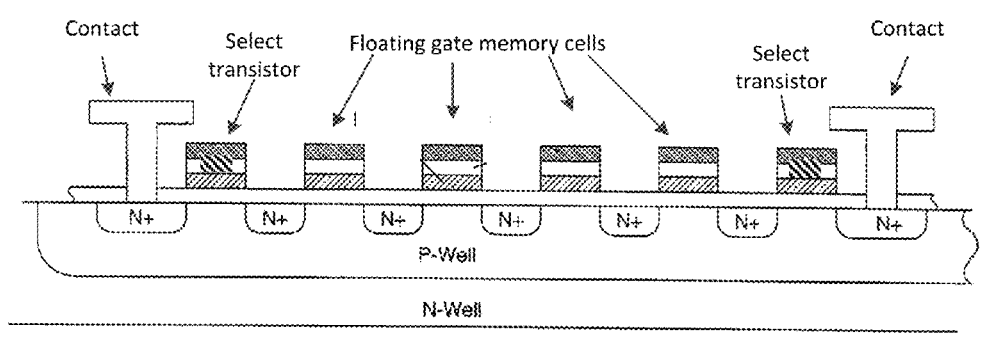
FIG._2B (PRIOR ART)
(Section A-A)

(Section B-B)

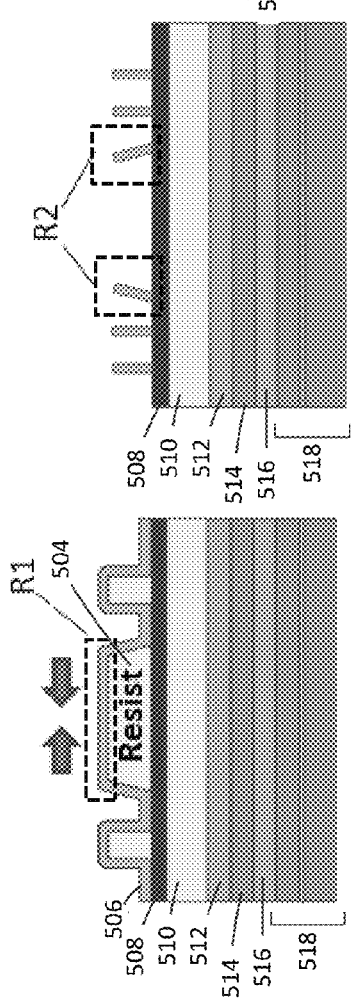
FIG. 5
FIG. 6
FIG. 7
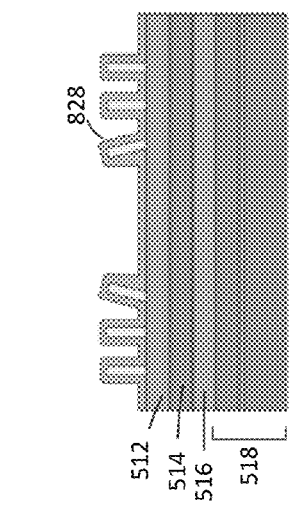
FIG. 8
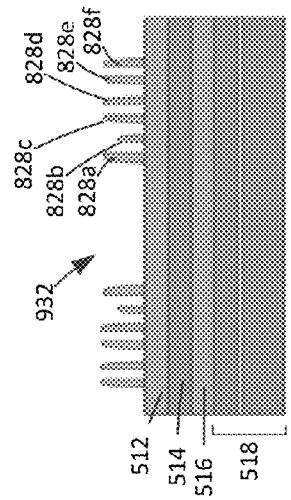
FIG. 9
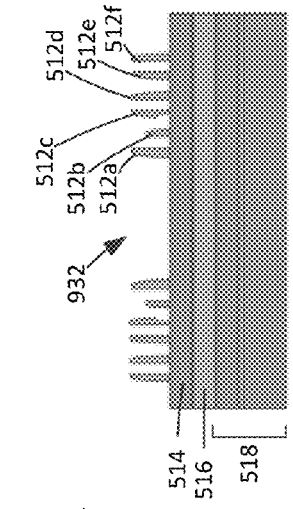
FIG. 10

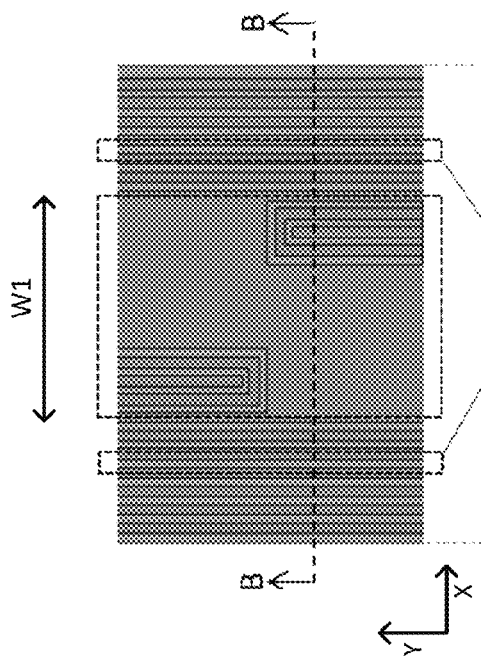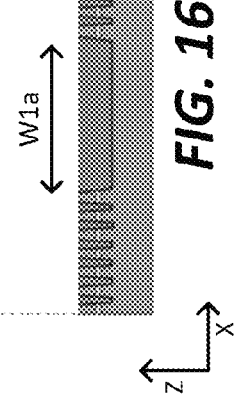
FIG. 16A
FIG. 16B
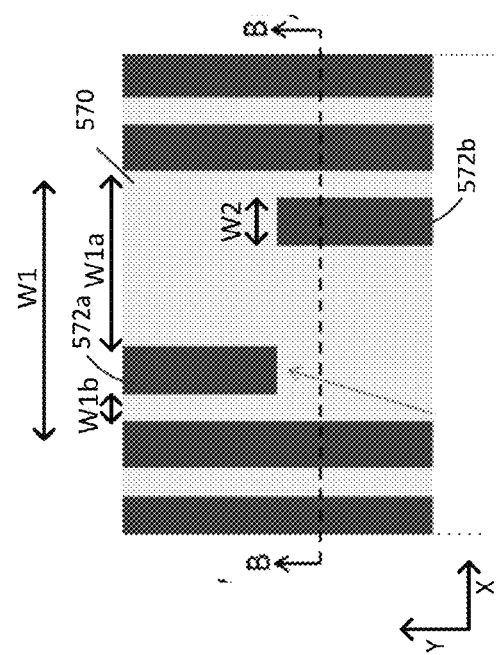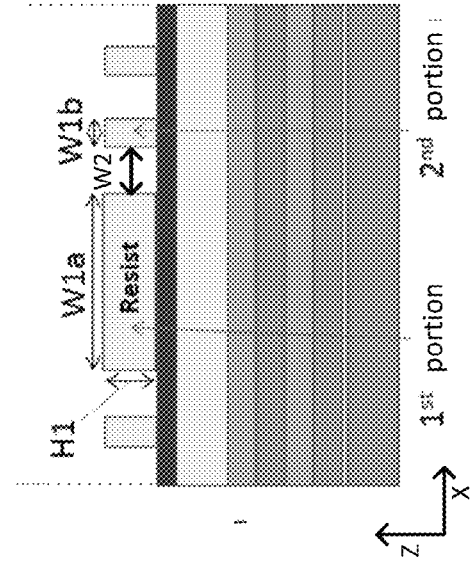
FIG. 15A
FIG. 15B

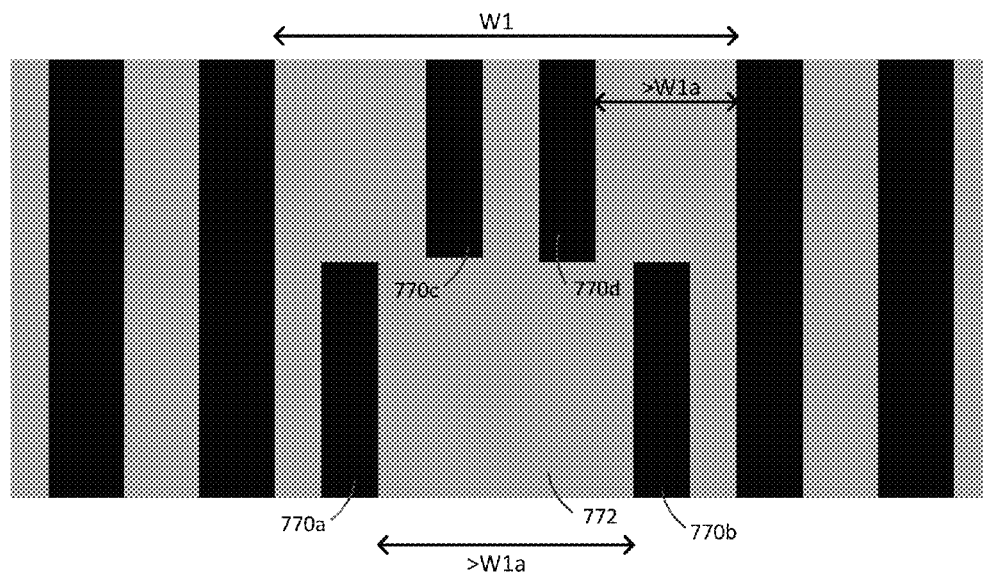
FIG. 17
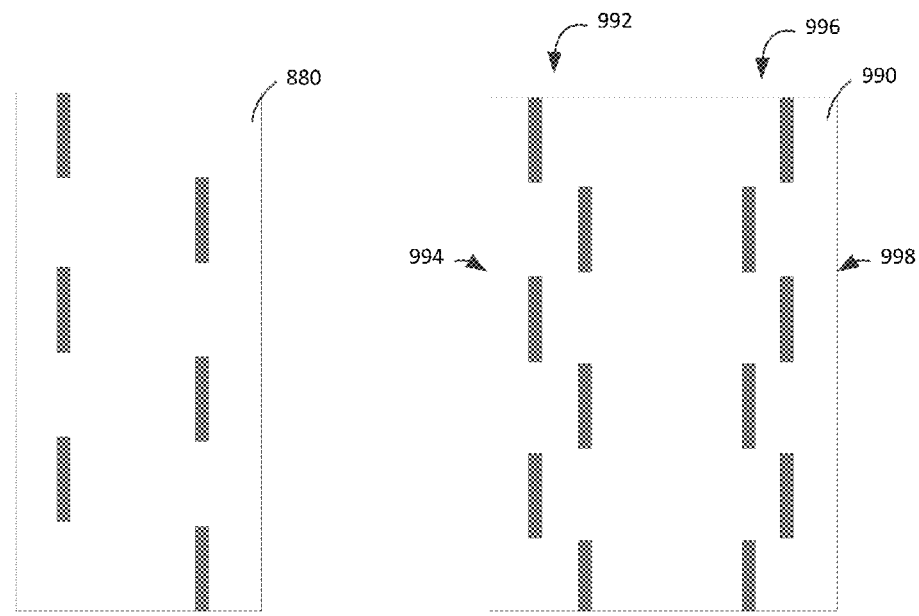
FIG. 18          FIG. 19

CONDUCTIVE LINE STRUCTURE WITH OPENINGS

BACKGROUND

This application relates generally to the formation of conductive metal lines that are formed over integrated circuits such as nonvolatile memory arrays.

There are many commercially successful non-volatile memory products being used today, particularly in the form of small form factor cards, USB drives, embedded memory, and Solid State Drives (SSDs) which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom of the string connect to the bit line and a common source line respectively through select transistors (source select transistor and drain select transistor). Select transistors do not contain floating gates and are used to connect NAND strings to control circuits when they are to be accessed, and to isolate them when they are not being accessed.

NAND strings are generally connected by conductive lines in order to form arrays that may contain many NAND strings. At either end of a NAND string a contact area may be formed. This allows connection of the NAND string as part of the array. Metal contacts may be formed over contact areas to connect the contact areas (and thereby connect NAND strings) to conductive metal lines that extend over the memory array (e.g. bit lines). FIG. 2A shows bit line contacts BL0-BL4 and common source line contacts at either end of NAND strings. Contacts to contact areas may be formed by etching contact holes through a dielectric layer and then filling the holes with metal. Metal lines, such as bit lines, extend over the memory array and in peripheral areas in order to connect the memory array and various peripheral circuits. These metal lines may be close together (particularly in the memory array area where bit lines may be very close) which tends to make processing difficult.

SUMMARY

A process for forming bit lines and wide conductive lines (wider than bit lines) in the same metal layer uses mandrels to define sidewall spacers. Wide mandrels corresponding to wide conductive lines may be formed encompassing openings (e.g. in the form of slits running in the direction of the conductive line). By forming openings at appropriate locations the wide mandrel may be separated into portions that are individually narrower than the entire mandrel. When sidewall material is deposited over narrower portions there is less deformation of sidewall spacers due to stress and less chance of damaging adjacent sidewall spacers used to pattern bit lines. Thus, the risk of defective bit lines may be reduced. Openings may be arranged so that the distance from a side of the mandrel to the nearest opening is less than a predetermined limit which is chosen to ensure that deformation of sidewalls is low (e.g. three times the height of the mandrel). Openings may vary in location along a mandrel. For example, where a first slit ends a second slit may begin with some offset between the first and second slits so that the wide mandrel is not cut-off (i.e. remains a single continuous body). Conductive lines formed using such mandrels have openings corresponding to the mandrel openings and may have one or more isolated conductive portions in the openings as a result of sidewall spacer patterning.

An example of a process for patterning narrow and wide features includes: forming a sacrificial layer; subsequently patterning the sacrificial layer into narrow strips and wide strips, an individual wide strip encompassing one or more openings through the sacrificial layer within a predetermined distance of a side of the individual wide strip; subsequently forming sidewall spacers along sides of the narrow strips and wide strips; subsequently removing the patterned sacrificial layer; and subsequently patterning one or more underlying layers according to the sidewall spacers.

The individual wide strip may encompass a plurality of openings, the individual wide strip may have a width in a first direction and may be elongated in a second direction that is perpendicular to the first direction, the plurality of openings arranged at different locations along the second direction in a non-overlapping arrangement that provides at least a minimum area in cross section along a plane perpendicular to the second direction at all locations of the wide strip along the second direction. The predetermined distance may be approximately equal to the thickness of the sacrificial layer multiplied by three and, throughout the individual wide strip, sides of the wide strip may be within the predetermined distance of at least one of the plurality of openings. The individual wide strip may be patterned by the plurality of openings into strip portions that are individually no wider than the predetermined distance. The predetermined distance may be 300 nanometers or less. The plurality of sidewall spacers may be substantially perpendicular to a primary surface of an underlying substrate. The plurality of sidewall spacers may deviate from perpendicular to the primary surface of the underlying substrate by less than eight degrees (8°). The sacrificial layer may be formed of resist. The one or more underlying layers may be indirectly patterned according to the sidewall spacers by forming secondary sidewall spacers along sides of the sidewall spacers, removing the sidewall spacers, and patterning the one or more underlying layers according to the secondary sidewall spacers. The secondary sidewall spacers formed along sides of sidewall spacers formed along sides of narrow strips may define bit lines of a nonvolatile memory.

An example of a nonvolatile memory integrated circuit includes: a plurality of bit lines formed in a metal layer extending above a nonvolatile memory array, an individual bit line having a first width; a conductive line formed in the metal layer, the conductive line having a second width that is greater than the first width; and a plurality of openings in the conductive line, each of the plurality of openings extending vertically through the conductive line within a predetermined distance from a side of the conductive line.

The conductive line may have the second width in a first direction and may be elongated in a second direction that is perpendicular to the first direction, the plurality of openings arranged at different locations along the second direction in a non-overlapping arrangement that provides at least a minimum conductive line area in cross section along a plane perpendicular to the second direction at all locations of the conductive line along the second direction. The conductive line may be patterned by the plurality of openings into strip portions that are individually no wider than the predetermined distance. The predetermined distance may be 300 nanometers or less. Portions of the metal layer may be located within the plurality of openings in the conductive line and isolated from the conductive line. The portions of the metal layer may include closed loops of metal. An individual opening may have a shape when viewed in cross section along a horizontal plane and a closed loop of metal may be located in the opening, the closed loop having the shape of the opening with horizontal dimensions that are smaller than corresponding dimensions of the individual opening, the closed loop of metal separated from sides of the opening by a uniform distance. A portion of the metal layer may be formed within the closed loop of metal and isolated from the closed loop of metal.

An example of a process for patterning narrow and wide features includes: forming a sacrificial layer having a layer thickness; subsequently patterning the sacrificial layer into narrow strips and wide strips, an individual wide strip extending in a first direction and encompassing a plurality of slits through the sacrificial layer, each of the plurality of slits extending in the first direction and located within a predetermined distance of a side of the individual wide strip in a second direction that is perpendicular to the first direction, the predetermined distance being approximately three times the layer thickness; subsequently forming sidewall spacers along sides of the narrow strips and wide strips; subsequently removing the patterned sacrificial layer; and subsequently patterning one or more underlying layers according to the sidewall spacers so that a bit line pattern is defined by the sidewall spacers along sides of the narrow strips and so that a wide conductor is formed at a location corresponding to the individual wide strip.

Various aspects, advantages, features and embodiments are included in the following description of examples, which description should be taken in conjunction with the accompanying drawings.

BRIEF DESCRIPTION OF THE DRAWINGS

FIG. 1 is a block diagram of a prior art memory system.
FIG. 2A is a plan view of a prior art NAND array.
FIG. 2B shows a cross section of the NAND array of FIG. 2A.
FIG. 5 illustrates deformation of a sidewall layer over a resist mandrel.
FIG. 6 shows the structure of FIG. 5 after etching back and removal of resist.
FIG. 7 shows transfer of the pattern of FIG. 6 to an underlying layer.
FIG. 8 illustrates formation of a second sidewall layer.
FIG. 9 shows a second sidewall spacer pattern.
FIG. 10 shows transfer of the second sidewall spacer pattern to an underlying layer.
FIGS. 15A-B show a mandrel with openings.
FIGS. 16A-B show a metal layer patterned using sidewall spacers formed by mandrels of FIGS. 15A-B.
FIG. 17 shows a mandrel with two slits.
FIG. 18 shows a pattern of non-overlapping slits with alternating locations.
FIG. 19 shows a pattern of slits in which two slits are provided at all locations along the mandrel, one for each side of the mandrel.

DETAILED DESCRIPTION OF EXEMPLARY EMBODIMENTS

Memory System

Figure 2C:
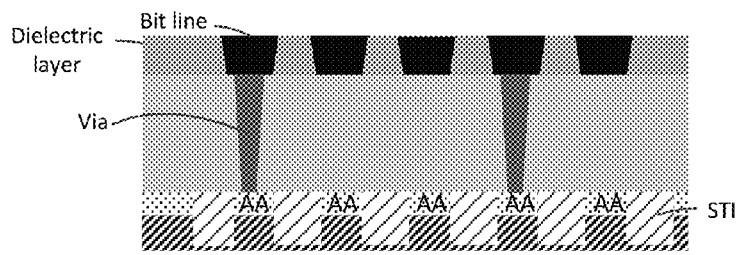
FIG. 2C shows another cross section of the NAND array of FIG. 2A.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described may be used. Embodiments include all relevant memory structures within the spirit and scope of the attached claims.

An example of a prior art memory system, which may be modified to include various systems and methods described here, is illustrated by the block diagram of FIG. 1. A planar memory cell array 1 including a plurality of memory cells is controlled by a column control circuit 2, a row control circuit 3, a c-source control circuit 4 and a c-p-well control circuit 5. The memory cell array 1 is, in this example, of the NAND type similar to that described above in the Background and in references incorporated therein by reference. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertable into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device. Flash memory, either embedded or removable, may be used in a variety of different environments including in mobile devices such as phones, tablets, cameras, etc. and in larger systems such as servers.

FIGS. 2A-2C show different views of a prior art NAND flash memory. In particular, FIG. 2A shows a plan view of a portion of such a memory array including bit lines and word lines (this is a simplified structure with a small number of word lines and bit lines). FIG. 2B shows a cross section along A-A (along a NAND string) showing individual memory cells that are connected in series. Contacts, or vias, are formed at either end to connect the NAND strings in the memory array to conductive lines (e.g. connecting to bit lines at one end and to a common source line at the other end). Such a via may be formed of metal that is deposited into a contact hole that is formed in a dielectric layer. FIG. 2C shows a cross section along B-B of FIG. 2A. This view shows metal vias extending down through contact holes in a dielectric layer to make contact with active areas ("AA") in the substrate (i.e. with N+ areas of FIG. 2B). STI regions are located between active areas of different strings to electrically isolate an individual NAND string from its neighbors. Bit lines extend over the memory array in a direction perpendicular to the cross section shown. Alternating bit lines are connected to vias in the cross section shown. (It will be understood that other vias, that are not visible in the cross section shown, connect the remaining bit lines to other active areas). In this arrangement, locations of vias alternate so that there is more space between vias and thus less risk of contact between vias. Other arrangements are also possible. In some cases, bit lines are separated by air gaps instead of dielectric.

In some memories, conductive lines other than bit lines may be formed of the same metal layer that forms the bit lines. While bit lines may be very narrow where the pitch of the memory array is small, other conductive lines may not be constrained by memory array pitch and may be wider than bit lines so that they have lower electrical resistance. Such wide lines may extend over the memory array in some cases and may be in close proximity to bit lines. Wide lines may also extend into peripheral areas outside the memory array area to connect with peripheral circuits.

Figure 3A:
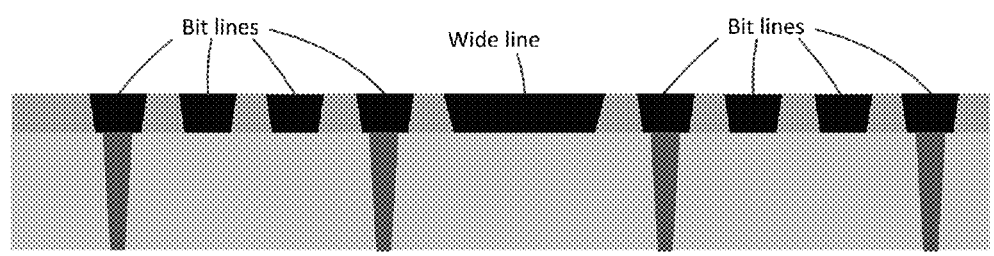
FIG. 3A shows a cross section showing bit lines and a wide conductive line formed from the same metal layer.

FIG. 3A shows an example of a wide line that extends in close proximity to bit lines and is formed in the same metal layer in which bit lines are formed. The width of such wide lines may be determined by a number of factors including reduction of delay, reduction of power consumed (and heat generated) by line resistance, and other factors.

Figure 3B:
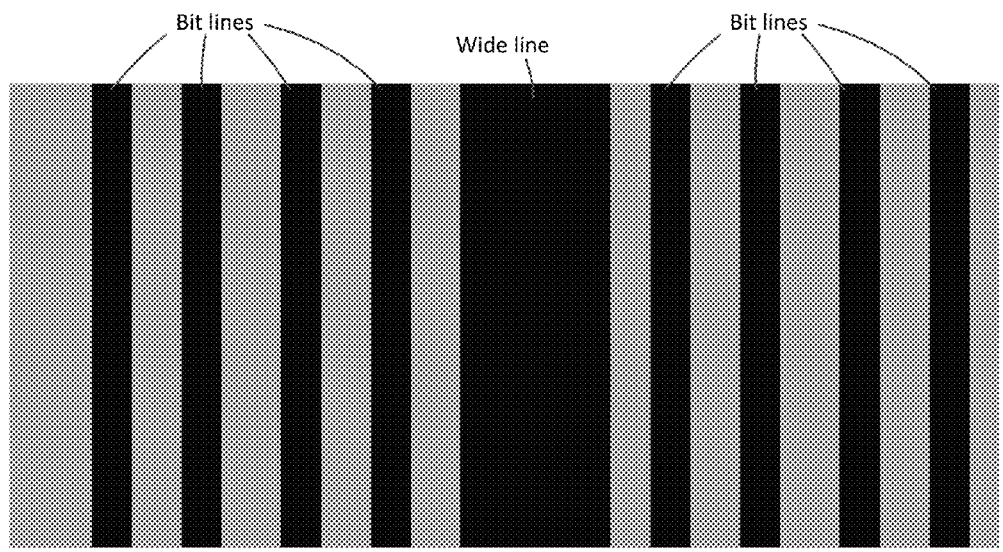
FIG. 3B shows a plan view corresponding to FIG. 3A.

FIG. 3B shows the bit lines and wide line of FIG. 3A in top-down plan view. Various processes may be used to pattern both wide lines and narrow lines using a common set of process steps. One method that may be used forms sidewall spacers along sides of mandrel structures formed of a sacrificial material such as photoresist ("resist"). Such sidewalls may be used for patterning underlying layers. Another set of sidewall spacers may be formed on sides of the original sidewall spacers (or on spacers formed in the same pattern in an underlying layer) in a double patterning scheme.

Figure 4:
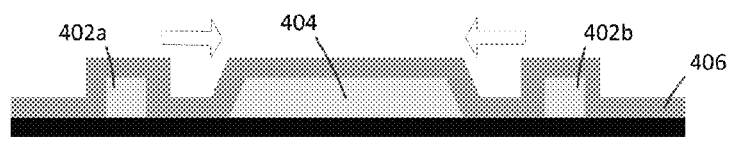
FIG. 4 illustrates deformation resulting from stress caused by a wide mandrel.

One problem that may occur when forming wide lines and narrow lines (such as bit lines) in close proximity relates to the effects of stress in the sidewall material that is deposited on wide mandrels. FIG. 4 shows an example of narrow mandrels 402a-b in areas where bit lines are to be formed and a wide mandrel 404 in an area where a wide line is to be formed. The mandrel material is resist in this example and the sidewall layer 406 is silicon oxide (e.g. SiO2). After deposition, the silicon oxide layer 406 shrinks and tends to produce tensile stress as a result (i.e. mechanical forces tend to point inwards as shown by arrows). Such stress can deform the sidewall layer in some areas. For example along sides of wide mandrels 404 as shown in FIG. 4. While such forces may develop where sidewall material overlies both narrow and wide mandrels the effects of such forces are more significant on wide mandrels. Shrinkage over wide mandrels may cause sidewalls to be deformed so that they incline inwards as shown. The sidewalls produced may be angled inwards in a manner that has serious consequences for further processing. (Shrinkage over narrow mandrels is in proportion to the width of the narrow mandrels and does not generally produce a significant angular deformation.) Angled sidewalls may affect neighboring features during subsequent processing and thus affect the bit lines that are ultimately formed by this patterning.

FIGS. 5-13 show one example of how deformation of sidewall material over wide mandrels may affect formation of nearby bit lines. FIG. 5 shows an example of a stack of layers at an intermediate stage of fabrication after deposition of silicon oxide sidewall layer 506 on sacrificial mandrels formed of resist. The stack of layers includes a Spin On Glass (SOG) layer 508, Spin On Carbon (SOC) layer 510, amorphous silicon layer 512, silicon oxide layer 514, amorphous silicon layer 516, and silicon oxide layer 518 (which may include an etch stop layer such as a silicon nitride (SiN) etch stop layer). In the area R1 over a wide mandrel there is significant shrinking of sidewall material that results in sidewalls being angled inwards.

FIG. 6 shows the structure of FIG. 5 after etching back of the sidewall material 506 to leave sidewall spacers and after removal of the resist 504. While sidewall spacers formed along sides of narrow mandrels are substantially vertical with respect to the plane of the substrate (and the plane of underlying layers that are formed on the surface of the substrate) the sidewall spacers formed along sides of the wide mandrel 504 in R2 are tilted inwards as shown in region R2.

FIG. 7 shows the pattern of sidewall spacers of FIG. 6 reproduced in a lower layer of Spin On Carbon (SOC) 510. The pattern may be reproduced by anisotropic etching using the pattern of sidewall spacers as a hard mask layer. Tilted sidewall spacers may be reproduced in the SOC layer 510 as shown at R3.

FIG. 8 shows a step of depositing a second sidewall layer 828. Second sidewall layer 828 is formed of silicon oxide in this example. While second sidewall layer 828 is deposited symmetrically along both sides of vertical spacers, the second sidewall layer is deposited asymmetrically along sides of tilted spacers.

FIG. 9 shows the results of etching back the second sidewall layer 828 to form individual spacers, e.g. spacers 828a-f, and removing the SOC spacers. Because of asymmetric deposition of the second sidewall layer (and/or asymmetric etching back of the second sidewall layer 828), not all spacers are identical. In particular, the second spacer 828b from central opening 932 is shorter than other sidewall spacers 828a, 828c-f and may be tilted (i.e. may not be vertical).

FIG. 10 shows the pattern of FIG. 9 transferred to an underlying layer of amorphous silicon 512 to form spacers, e.g. spacers 512a-f. Not all spacers are identical. In particular, the second spacer 512b from the central opening 932 is shorter than other sidewall spacers, e.g. spacers 512a, 512c-f, and the third sidewall spacer 512c from the central area 932 has some etch damage along the side where it is exposed to increased etching because the adjacent spacer 512b is short.

Figure 11:
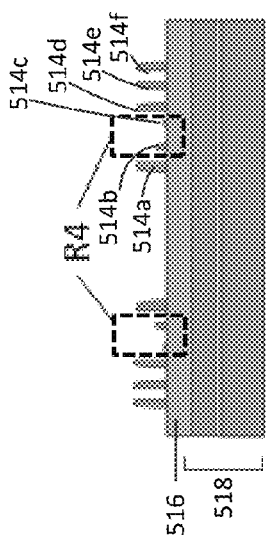
FIG. 11 illustrates damaged second sidewall spacers resulting from deformation.

FIG. 11 shows the pattern of FIG. 10 transferred to an underlying layer of silicon oxide 514 to form spacers, e.g. spacers 514a-f. Silicon oxide layer 514 may be formed by Chemical Vapor Deposition (CVD) using Tetraethyl orthosilicate (TEOS). Both second spacer 514b and third spacer 514c from the central opening are significantly shorter in region R4 in this example.

Figure 12:
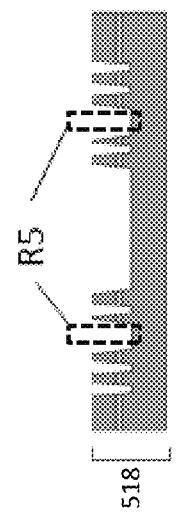
FIG. 12 illustrates missing insulator material in certain areas.

FIG. 12 shows transfer of the pattern of FIG. 11 to a silicon oxide layer 518 and shows spacers region R5 being absent.

Figure 13:
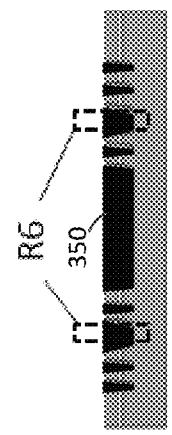
FIG. 13 illustrates physically joined bit lines resulting from missing insulator.

FIG. 13 shows the results of depositing copper (Cu) over the structure of FIG. 12 and planarizing the resulting structure in a damascene process to form copper lines including a wide line 350 and bit lines. It can be seen that in region R6 where spacers are missing, copper extends between trenches so that two conductive lines (bit lines) are connected together. Such electrically connected (shorted) bit lines may result in a die being inoperable. It will be understood that even where there is some separation between bit lines, if there is insufficient space between bit lines there may be significant coupling which may still be undesirable (even if the memory is operable). While the above example gives specific materials and illustrates specific problems, other materials may be used and other problems may manifest as a result of wide mandrels.

Figure 14:
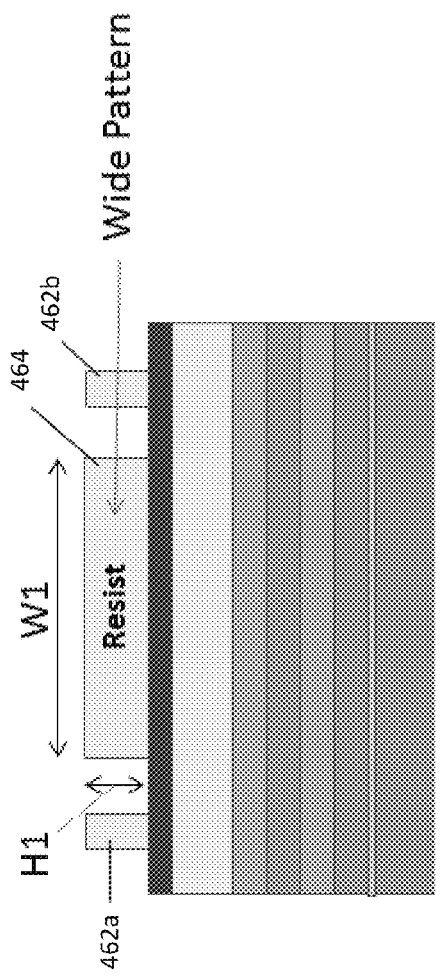
FIG. 14 shows dimensions of a wide mandrel.

In general, deformation of sidewall spacers increases with line width. FIG. 14 illustrates a pattern formed in a resist layer of thickness H1 that includes narrow mandrels 462a-b and a wide mandrel 464 that has a width W1. Where W1 is relatively small deformation may be insignificant (deformation is also insignificant for narrow mandrels 462a-b that form bit lines). However, where W1 is large deformation may be significant and may have undesirable consequences. For example, bit lines formed nearby may be affected. In one example, for a silicon oxide sidewall layer over resist mandrels, it has been found that acceptable results (e.g. an angle of deformation less than eight degrees) are obtained when W1 is less than three times H1 (W1<3*H1). It will be understood that this is a particular example and that other materials and geometries may produce different results.

Examples below are directed to providing wide conductive lines in a process that does not produce significant deformation of sidewall spacers. Thus, wide conductive lines and narrow conductive lines can be produced by a common set of process steps with a low risk of shorting of narrow conductive lines.

FIG. 15A shows a top-down plan view of a pattern of mandrels that are used to produce both wide and narrow conductive lines. Unlike previous examples (e.g. FIG. 3B) the mandrel 570 corresponding to the wide line in this example includes openings 572a-b, which in this example extend in the direction of the wide line (i.e. in y-direction) as slits (i.e. elongated in the same direction as the wide mandrel 570 in which they are formed). The slits may be of any suitable width, for example the minimum feature size of the patterning process used to pattern the resist layer.

FIG. 15B shows the structure of FIG. 15A in cross section along a vertical plane indicated by B-B in FIG. 15A. It can be seen that instead of a continuous portion of resist extending across the area where a wide conductive line is to be formed, the cross section shows two portions of resist, one having a width W1a and one having a width W1b, that are separated by a slit having a width W2 (the portions are connected out of the plane of FIG. 15B as shown in FIG. 15A). Thus, instead of a mandrel extending continuously across the entire width W1, mandrel 570 includes slits that separate the mandrel into connected strips having widths W1a and W1b. Both widths W1a and W1b may be maintained below a maximum width in order to avoid significant deformation of sidewall spacers. For example, slits may be located so that W1a (the wider strip) may be less than 3*H1. In the example of FIG. 15A a single slit is sufficient to achieve this. The location of the slit is varied from side to side along the length of the wide mandrel 570 (while two positions are shown, other examples may include additional variation over a larger number of positions).

FIGS. 16A and 16B show views corresponding to FIGS. 15A and 15B respectively at a later stage of fabrication. It can be seen that the footprint of the wide conductive line is approximately W1, which may exceed a safe limit for continuous mandrel width. In this example, no single portion of the resulting conductive line extends laterally (e.g. along B-B) for more than W1a, which is less than W1. Because sidewall deformation is avoided, bit lines are formed with adequate separation as shown in region R12. Thus, forming slits in a mandrel may allow a wider mandrel and thus allow formation of a wider conductive line (with lower resistance) than would otherwise be possible without significant risk to adjacent structures.

While the pattern shown in FIGS. 15A-16B is an example of a pattern of openings that may reduce the effects of wide mandrels when forming wide and narrow conductive lines other patterns are also possible. For example, FIG. 17 shows an example where a wide mandrel has two slits at any given location along its length, one corresponding to each side so that there is always a slit close to a side (i.e. so that the width of a mandrel portion along a side does not exceed a safe width W1a). The positions of the slits within the wide mandrel may be varied as shown so that they are closer to the sides at some locations (e.g. slits 770a-b) and further away at other locations (e.g. slits 770c-d). In some examples, interior portions of such mandrels may extend laterally a distance that produces significant sidewall deformation. For example, central portion 772 may be wider than a safe limit for sidewall deformation (e.g. wider than W1a above). Because this portion is not adjacent to either side of the mandrel, any deformed sidewalls are remote from sidewalls that pattern bit lines. Deformed sidewalls at such interior locations may not have significant consequences and may be permissible.

While the examples discussed above show relatively short portions of conductive lines, it will be understood that the patterns described may extend over significant distances with the pattern repeating at some interval (or being substantially randomized). FIG. 18 shows a pattern of non-overlapping slits that are located so that at every location along the wide mandrel one and only one slit is provided. Thus, cross sectional area is maintained (is only reduced by one slit) while stress relief is provided at all locations.

FIG. 19 shows an example of a mandrel 990 with a pattern that includes a set 992 of non-overlapping slits near one side 994 and another set of non-overlapping slits 996 near the other side 998. The two sets separately provide stress relief near each side. Such a pattern may be suitable for wider mandrels where a single slit is not suitable for providing stress relief (e.g. where the width of the mandrel exceeds six times the height of the sacrificial layer). The width of a central area in such a pattern may be permitted to exceed a width limit for sidewall deformation because any sidewall deformed as a result is unlikely to affect other structures.

Wide conductive lines may extend beyond an array area into a peripheral area. At some locations wide conductive lines may no longer be in close proximity to bit lines. At these locations, the risk from sidewall deformation due to wide mandrels is reduced (i.e. there may be no nearby sidewalls to be affected). Slits may not be provided at such locations.

Mandrel patterns may affect subsequently formed metal layer patterns so that modifying a wide mandrel may modify resulting wide conductive lines. The formation of openings in mandrels may result in formation of isolated portions of conductive material of a metal layer during subsequent processing. For example, using a double patterning process as previously described may leave portions of metal layer material within openings.

Figure 20A:
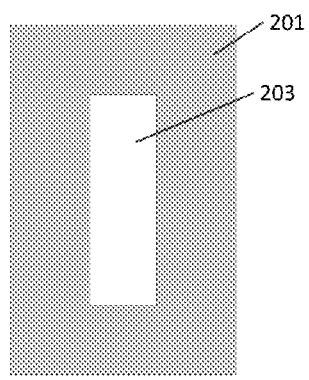
FIGS. 20A-E illustrate metal portions formed in openings in wide conductive lines.
Figure 20B:
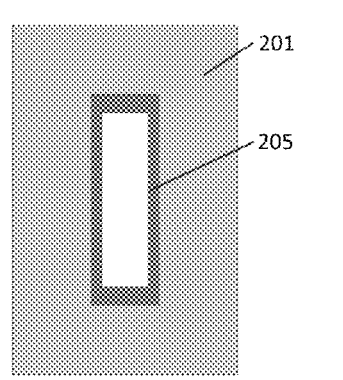
Figure 20C:
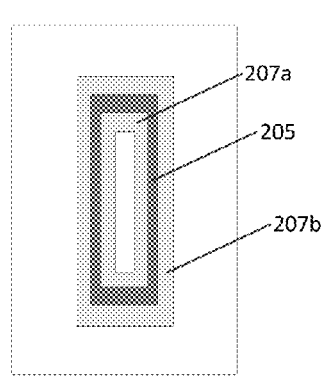
Figure 20D:
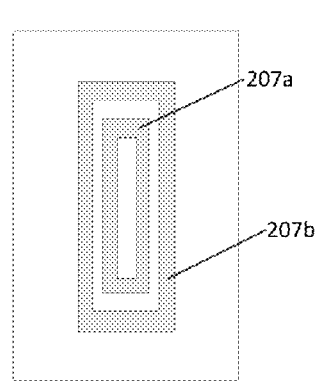
Figure 20E:
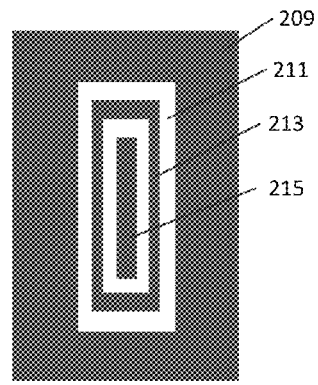

FIGS. 20A-E show how openings in wide mandrels may result in subsequent formation of openings in conductive lines that contain isolated metal portions. FIG. 20A shows a portion of a mandrel 201 with an opening 203 that extends through mandrel 201 to expose an underlying layer. FIG. 20B shows formation of a first sidewall 205 within this opening (other sidewalls are formed outside the region illustrated). For example a sidewall material may be deposited and then etched back to leave the first sidewall 205 as shown. Subsequently, as shown in FIG. 20C the mandrel 201 is removed and the first sidewall is used to form second sidewalls 207a-b (this may be done indirectly, i.e. the first sidewall 205 may be used to pattern a layer of an underlying material into mandrels which are then used to form the second sidewalls). The first sidewall 205 is removed leaving second sidewalls 207a-b as shown in FIG. 20D. Then the second sidewalls 207a-b are used to establish a pattern for damascene formation of a wide conductive line 209 that includes the opening 211 as shown in FIG. 20E. Within the opening 211 are two portions 213, 215 of the conductive line material (e.g. copper or other metal). Portion 213 forms a closed loop of conductive line material that is located a uniform distance from inner walls of opening 211. Portion 215 forms a strip of conductive line material that is located within closed loop 213. Both closed loop 213 and the strip 215 are isolated from wide conductive line 209 and from each other.

Other patterns of openings may also be formed including irregular slits, slits that are angled with respect to sides of mandrels, or other shaped openings such as curved, or round openings.

CONCLUSION

Although the various aspects have been described with respect to exemplary embodiments, it will be understood that protection within the full scope of the appended claims is appropriate. Furthermore, although the present application teaches methods for implementation with respect to particular prior art structures, it will be understood that implementation in memory arrays with architectures different than those described is also entitled to protection.

It is claimed:

1. A process for patterning narrow and wide features comprising:
   forming a sacrificial layer;
   subsequently patterning the sacrificial layer into narrow strips and wide strips, an individual wide strip encompassing one or more openings through the sacrificial layer within a predetermined distance of a side of the individual wide strip;
   subsequently forming sidewall spacers along sides of the narrow strips and wide strips;
   subsequently removing the patterned sacrificial layer;
   subsequently patterning one or more underlying layers according to the sidewall spacers; and
   wherein the one or more underlying layers are indirectly patterned according to the sidewall spacers by forming secondary sidewall spacers along sides of the sidewall spacers, removing the sidewall spacers, and patterning the one or more underlying layers according to the secondary sidewall spacers.

2. The process of claim 1 wherein the individual wide strip encompasses a plurality of openings, the individual wide strip having a width in a first direction and being elongated in a second direction that is perpendicular to the first direction, the plurality of openings arranged at different locations along the second direction in a non-overlapping arrangement that provides at least a minimum area in cross section along a plane perpendicular to the second direction at all locations of the wide strip along the second direction.

3. The process of claim 2 wherein the predetermined distance is approximately equal to thickness of the sacrificial layer multiplied by three and, throughout the individual wide strip, sides of the wide strip are within the predetermined distance of at least one of the plurality of openings.

4. The process of claim 2 wherein the individual wide strip is patterned by the plurality of openings into strip portions that are individually no wider than the predetermined distance.

5. The process of claim 3 wherein the predetermined distance is 300 nanometers or less.

6. The process of claim 4 wherein the predetermined distance is 300 nanometers or less.

7. The process of claim 1 wherein the plurality of sidewall spacers are substantially perpendicular to a primary surface of an underlying substrate.

8. The process of claim 7 wherein the plurality of sidewall spacers have an angle of deformation less than eight degrees (8°).

9. The process of claim 1 wherein the sacrificial layer is formed of resist.

10. The process of claim 1 wherein secondary sidewall spacers formed along sides of sidewall spacers formed along sides of narrow strips define bit lines of a nonvolatile memory.

11. A process for patterning narrow and wide features comprising:
   forming a sacrificial layer having a layer thickness;
   subsequently patterning the sacrificial layer into narrow strips and wide strips, an individual wide strip extending in a first direction and encompassing a plurality of slits through the sacrificial layer, each of the plurality of slits extending in the first direction and located within a predetermined distance of a side of the individual wide strip in a second direction that is perpendicular to the first direction, the predetermined distance being approximately three times the layer thickness;

subsequently forming sidewall spacers along sides of the narrow strips and wide strips;

subsequently removing the patterned sacrificial layer; and subsequently patterning one or more underlying layers according to the sidewall spacers so that a bit line pattern is defined by the sidewall spacers along sides of the narrow strips and so that a wide conductor is formed at a location corresponding to the individual wide strip.

12. The process of claim 11 wherein the plurality of slits are arranged at different locations along the first direction in a non-overlapping arrangement that provides at least a minimum area in cross section along a plane perpendicular to the first direction at all locations of the wide strip along the first direction.

13. The process of claim 12 wherein, throughout the individual wide strip, sides of the wide strip are within the predetermined distance of at least one of the plurality of openings.

14. The process of claim 12 wherein the individual wide strip is patterned by the plurality of openings into strip portions that are individually no wider than the predetermined distance.

15. The process of claim 13 wherein the predetermined distance is 300 nanometers or less.

16. The process of claim 14 wherein the predetermined distance is 300 nanometers or less.

17. The process of claim 11 wherein the plurality of sidewall spacers are substantially perpendicular to a primary surface of an underlying substrate.

18. The process of claim 11 wherein the plurality of sidewall spacers have an angle of deformation less than eight degrees (8°).

19. The process of claim 11 wherein the sacrificial layer is formed of resist.

20. The process of claim 11 wherein the one or more underlying layers are indirectly patterned according to the sidewall spacers by forming secondary sidewall spacers along sides of the sidewall spacers, removing the sidewall spacers, and patterning the one or more underlying layers according to the secondary sidewall spacers.

21. The process of claim 20 wherein secondary sidewall spacers formed along sides of sidewall spacers formed along sides of narrow strips define bit lines of a nonvolatile memory.

* * * * *